United States Patent
Choi et al.

(10) Patent No.: US 11,410,736 B2
(45) Date of Patent: Aug. 9, 2022

(54) SEMICONDUCTOR MEMORY DEVICE

(71) Applicant: SK hynix Inc., Gyeonggi-do (KR)

(72) Inventors: Hyung Jin Choi, Gyeonggi-do (KR); Sung Hyun Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 54 days.

(21) Appl. No.: 17/097,893

(22) Filed: Nov. 13, 2020

(65) Prior Publication Data
US 2022/0020436 A1 Jan. 20, 2022

(30) Foreign Application Priority Data
Jul. 17, 2020 (KR) .................. 10-2020-0088923

(51) Int. Cl.
*G11C 7/00* (2006.01)
*G11C 16/26* (2006.01)
*H01L 27/1157* (2017.01)
*H01L 27/11582* (2017.01)
*G11C 16/30* (2006.01)

(52) U.S. Cl.
CPC .............. *G11C 16/26* (2013.01); *G11C 16/30* (2013.01); *H01L 27/1157* (2013.01); *H01L 27/11582* (2013.01)

(58) Field of Classification Search
CPC ....... G11C 7/1051; G11C 7/1078; G11C 7/22; G11C 7/106; G11C 7/1057
USPC .............................. 365/189.05, 211
See application file for complete search history.

(56) References Cited

U.S. PATENT DOCUMENTS 10,224,102 B2 * 3/2019 Choi ...................... G11C 16/32
10,339,989 B2 * 7/2019 Kim ........................ G11C 7/12

FOREIGN PATENT DOCUMENTS

KR 10-2017-0055910 5/2017
KR 10-2017-0125578 11/2017
KR 10-1844963 4/2018

* cited by examiner

*Primary Examiner* — Son T Dinh
(74) *Attorney, Agent, or Firm* — IP & T Group LLP

(57) ABSTRACT

A semiconductor memory device includes a memory cell array, a page buffer, a control logic, and a voltage generator. The memory cell array includes memory cells. The page buffer is connected to the memory cells through a bit line and configure to read data of the memory cells. The control logic generates control signals for controlling the page buffer. The voltage generator generates activation voltages of the control signals. The page buffer includes a first transistor between the bit line and a first node, a second transistor between a power voltage and a second node, a third transistor between the first node and the second node, a fourth transistor between the second node and a third node, and a fifth transistor between the first node and the third node. The voltage generator controls a first control signal controlling the fifth transistor based on temperature of the semiconductor memory device.

20 Claims, 12 Drawing Sheets

SEMICONDUCTOR MEMORY DEVICE

CROSS-REFERENCE TO RELATED APPLICATION

The present application claims priority under 35 U.S.C. § 119(a) to Korean patent application number 10-2020-0088923, filed on Jul. 17, 2020, which is incorporated herein by reference in its entirety.

BACKGROUND

Field of Invention

The present disclosure relates to an electronic device, and more particularly, to a semiconductor memory device.

Description of Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional memory device has been designed to resolve a limit of integration of a two-dimensional memory device, and may include a plurality of memory cells that are vertically stacked on a semiconductor substrate.

SUMMARY

An embodiment of the present disclosure provides a semiconductor memory device with improved read performance according to temperature change.

A semiconductor memory device according to an embodiment of the present disclosure includes a memory cell array, a page buffer, a control logic, and a voltage generator. The memory cell array includes a plurality of memory cells for storing data. The page buffer is connected to at least one of the plurality of memory cells through a bit line and configured to read the data stored in the memory cell. The control logic generates a plurality of control signals for controlling an operation of the page buffer. The voltage generator generates activation voltages of the plurality of control signals. The page buffer includes a first transistor connected between the bit line and a first node, a second transistor connected between a power voltage and a second node, a third transistor connected between the first node and the second node, a fourth transistor connected between the second node and a third node, and a fifth transistor connected between the first node and the third node. The voltage generator is further configured to control an activation voltage of a first control signal controlling the fifth transistor among the plurality of control signals based on temperature of the semiconductor memory device.

In an embodiment, the first transistor, the third transistor, and the fifth transistor may be NMOS transistors, and the second transistor and the fourth transistor may be PMOS transistors.

In an embodiment, the voltage generator may increase the activation voltage of the first control signal when the temperature of the semiconductor memory device decreases.

In an embodiment, the voltage generator may be further configured to control an activation voltage of a second control signal controlling the third transistor among the plurality of control signals based on the temperature of the semiconductor memory device.

In an embodiment, the voltage generator may increase the activation voltage of the second control signal when the temperature of the semiconductor memory device decreases.

In an embodiment, the voltage generator may be further configured to control an activation voltage of a third control signal controlling the first transistor among the plurality of control signals based on the temperature of the semiconductor memory device.

In an embodiment, the voltage generator may increase the activation voltage of the third control signal when the temperature of the semiconductor memory device decreases.

In an embodiment, the page buffer may further include sixth and seventh transistors connected in series between the first node and a ground voltage, and a latch circuit connected to a gate of the second transistor and a gate of the seventh transistor.

In an embodiment, the page buffer may further include an eighth transistor connected between the power voltage and the third node.

In an embodiment, the semiconductor memory device may further include a temperature sensor configured to generate a temperature code by sensing the temperature of the semiconductor memory device. The voltage generator may control the activation voltage of the first control signal, the second control signal, and the third control signal based on the temperature code.

In an embodiment, the voltage generator may include a variable resistor of which a resistance value changes based on the temperature code.

In an embodiment, the activation voltage of the first control signal may be greater than the activation voltage of the second control signal.

In an embodiment, the activation voltage of the second control signal may be greater than the activation voltage of the third control signal.

A semiconductor memory device according to another embodiment of the present disclosure includes a page buffer and a voltage generator. The page buffer is connected to a bit line and configured to sense a threshold voltage of a memory cell. The voltage generator generates activation voltages of a plurality of control signals to be input to the page buffer. The page buffer includes a first NMOS transistor connected between the bit line and a common node, a first PMOS transistor connected between a power voltage and a sense amplifier node, a second NMOS transistor connected between the sense amplifier node and the common node, a second PMOS transistor connected between the sense amplifier node and a sensing node, and a third NMOS transistor connected between the common node and the sensing node. The voltage generator is configured to control an activation voltage of a sense amplifier sensing signal applied to a gate of the third NMOS transistor, among the plurality of control signals, based on a temperature of the semiconductor memory device.

In an embodiment, the voltage generator may be further configured to control an activation voltage of a current sensing signal applied to a gate of the second NMOS transistor, among the plurality of control signals, based on the temperature of the semiconductor memory device.

In an embodiment, the voltage generator may increase the activation voltages of the sense amplifier sensing signal and the current sensing signal when the temperature of the semiconductor memory device decreases.

In an embodiment, the activation voltage of the sense amplifier sensing signal may be greater than the activation voltage of the current sensing signal.

In an embodiment, the voltage generator may be further configured to control an activation voltage of a page buffer sensing signal applied to a gate of the first NMOS transistor among the plurality of control signals, based on the temperature of the semiconductor memory device.

In an embodiment, the voltage generator may increase the activation voltage of the page buffer sensing signal when the temperature of the semiconductor memory device decreases.

In an embodiment, the page buffer may further include fourth and fifth NMOS transistors connected in series between the common node and a ground voltage, a third PMOS transistor connected between the power voltage and the sensing node, and a sensing latch circuit connected to a gate of the first PMOS transistor and a gate of the fifth NMOS transistor.

A semiconductor memory device according to still another embodiment of the present disclosure includes a memory cell array, a page buffer and a voltage controller. The memory cell array is coupled to a bit line. The page buffer is configured to electrically couple the bit line and a common node according to an activation voltage level of a page buffer sensing signal, maintain a voltage level of the common node according to an activation voltage level of a current sensing signal, electrically couple the common node and a sensing node according to an activation voltage level of a sense amplifier sensing signal, and latch data corresponding to a voltage level of the sensing node. The voltage controller is configured to individually adjust, depending on temperature of the device, the respective activation voltage levels to different levels. The voltage controller is further configured to prevent decrease in margin between the activation voltage levels of the current sensing signal and the sense amplifier sensing signal.

The present technology may provide a semiconductor memory device with improved read performance according to a temperature change.

DETAILED DESCRIPTION

Specific structural and functional description provided herein is presented only to describe embodiments of the present disclosure. The invention, however, may be carried out in various ways and implemented in various forms. Thus, the invention is not limited to the embodiments described herein. Throughout the specification, reference to "an embodiment," "another embodiment" or the like is not necessarily to only one embodiment, and different references to any such phrase are not necessarily to the same embodiment(s).

Figure 1:
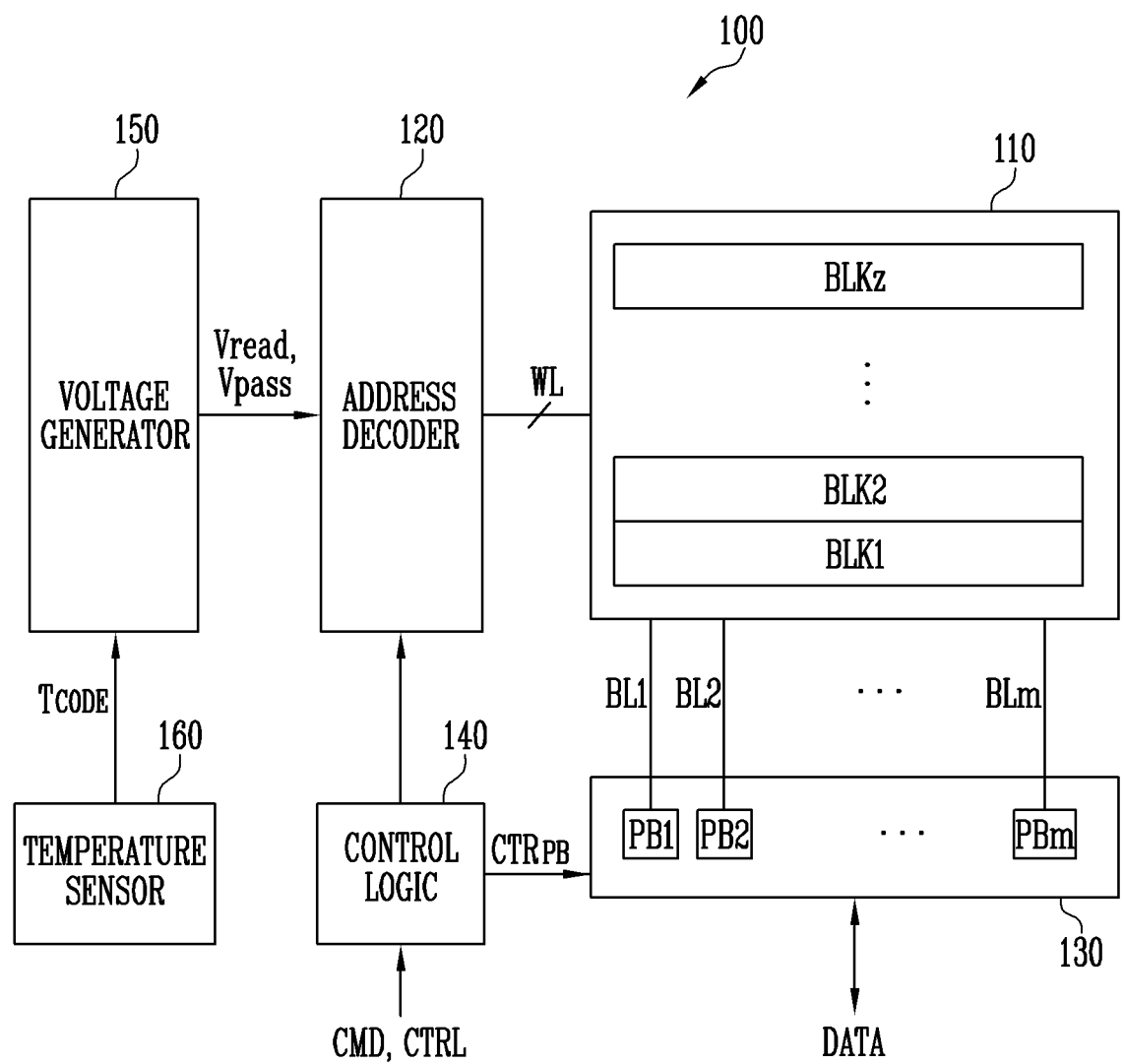
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 100 includes a memory cell array 110, an address decoder 120, a read and write circuit 130, control logic 140, a voltage generator 150, and a temperature sensor 160.

The memory cell array 110 includes a plurality of memory blocks BLK1 to BLKz, which are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, which may be configured with a vertical channel structure. The memory cell array 110 may be configured as a memory cell array of a two-dimensional structure. According to another embodiment, the memory cell array 110 may be configured as a memory cell array of a three-dimensional structure. Each of the plurality of memory cells in the memory cell array may store at least one bit of data. In different embodiments, each of the plurality of memory cells in the memory cell array 110 may be a single-level cell (SLC) storing one bit of data, a multi-level cell (MLC) storing two bits of data, a triple-level cell (TLC) storing three bits of data, or a quad-level cell (QLC) storing four bits of data. According to another embodiment, the memory cell array 110 may include a plurality of memory cells each storing five or more bits of data.

The address decoder 120, the read and write circuit 130, the control logic 140, the voltage generator 150, and the temperature sensor 160 operate as a peripheral circuit driving the memory cell array 110. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated in the voltage generator 150 to a selected word line of the selected memory block at a time of a read voltage application operation during a read operation, and applies a pass voltage Vpass to the remaining unselected word lines. In addition, during a program verify operation, the address decoder 120 applies a verify voltage generated in the voltage generator 150 to the selected word line of the selected memory block, and applies the pass voltage Vpass to the remaining unselected word lines.

The address decoder 120 is configured to decode a column address of the received addresses. The address decoder 120 transmits the decoded column address to the read and write circuit 130.

A read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm senses a change of an amount of a current flowing according to a programmed state of a corresponding memory cell through a sensing node while continuously supplying a sensing current to the bit lines connected to the memory cells, and latches the sensed change as sensing data. The read and write circuit 130 operates in response to page buffer control signals $CTR_{PB}$ output from the control logic 140.

During the read operation, the read and write circuit 130 senses data of the memory cell, temporarily stores read data, and outputs data DATA to the input/output buffer (not shown) of the semiconductor memory device 100. In an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operation of the semiconductor memory device 100 in response to the control signal CTRL. In addition, the control logic 140 outputs the control signal $CTR_{PB}$ for controlling the plurality of page buffers PB1 to PBm included in the read and write circuit 130. The control logic 140 may control the read and write circuit 130 to perform the read operation of the memory cell array 110.

The voltage generator 150 generates the read voltage Vread and the pass voltage Vpass during the read operation in response to a voltage generator control signal output from the control logic 140. In addition, the voltage generator 150 may generate a voltage for generating various control signals for controlling an operation of the semiconductor memory device.

The temperature sensor 160 may sense the temperature of the semiconductor memory device 100, generate a temperature code $T_{CODE}$ based on the sensing result, and transfer the temperature code $T_{CODE}$ to the voltage generator 150. The temperature code $T_{CODE}$ may be a digital code indicating the sensed temperature of the semiconductor memory device. The voltage generator 150 may control at least some of voltages required for the operation of the semiconductor memory device 100, based on the temperature code $T_{CODE}$.

The control logic 140 may output the control signal $CTR_{PB}$ for controlling the plurality of page buffers PB1 to PBm included in the read and write circuit 130. The control signal $CTR_{PB}$ may be generated based on the voltage generated by the voltage generator 150. The temperature sensor 160 may output the temperature code $T_{CODE}$ generated based on the sensed temperature of the semiconductor memory device 100 to the voltage generator 150. The voltage generator 150 may control, based on the temperature code $T_{CODE}$, a voltage level used for generating at least one of the control signals $CTR_{PB}$.

In general, an operation characteristic of memory cells included in the memory cell array 110 may change according to temperature change. In this case, when the page buffers PB1 to PBm are controlled using a constant control signal $CTR_{PB}$ regardless of temperature, reliability of the read operation may be reduced. According to an embodiment of the present disclosure, at least one voltage level among the control signals $CTR_{PB}$ for controlling the page buffers PB1 to PBm is controlled according to temperature change of the semiconductor memory device 100, and thus reduction in the reliability of a read operation as a result of temperature change may be prevented.

Figure 2:
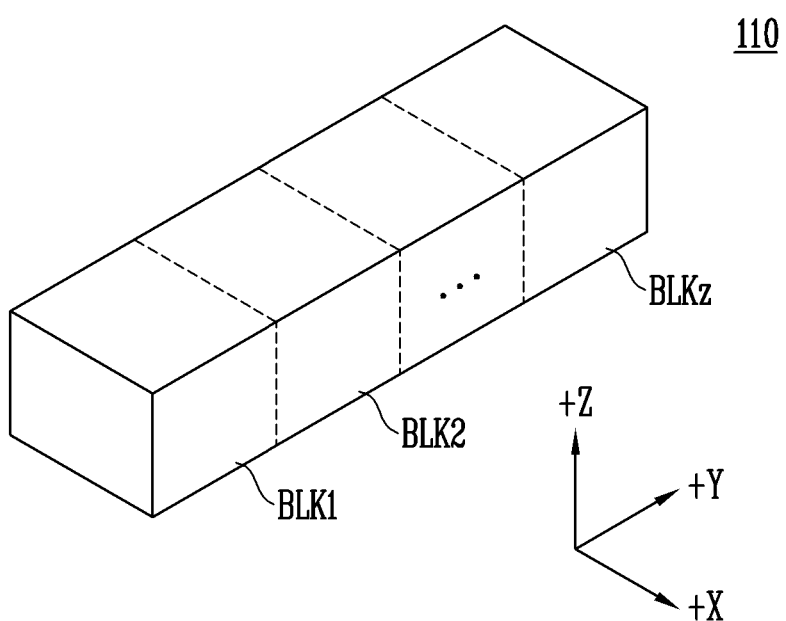
FIG. 2 is a block diagram showing an embodiment of a memory cell array, such as that of FIG. 1.

FIG. 2 is a block diagram showing an embodiment of the memory cell array of FIG. 1.

Referring to FIG. 2, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along +X +Y and +Z directions. A structure of a representative three-dimensional memory block is described in more detail with reference to FIGS. 3 and 4. In another embodiment, unlike the structure shown in FIG. 2, each memory block of the memory cell array 110 may have a two-dimensional structure.

Figure 3:
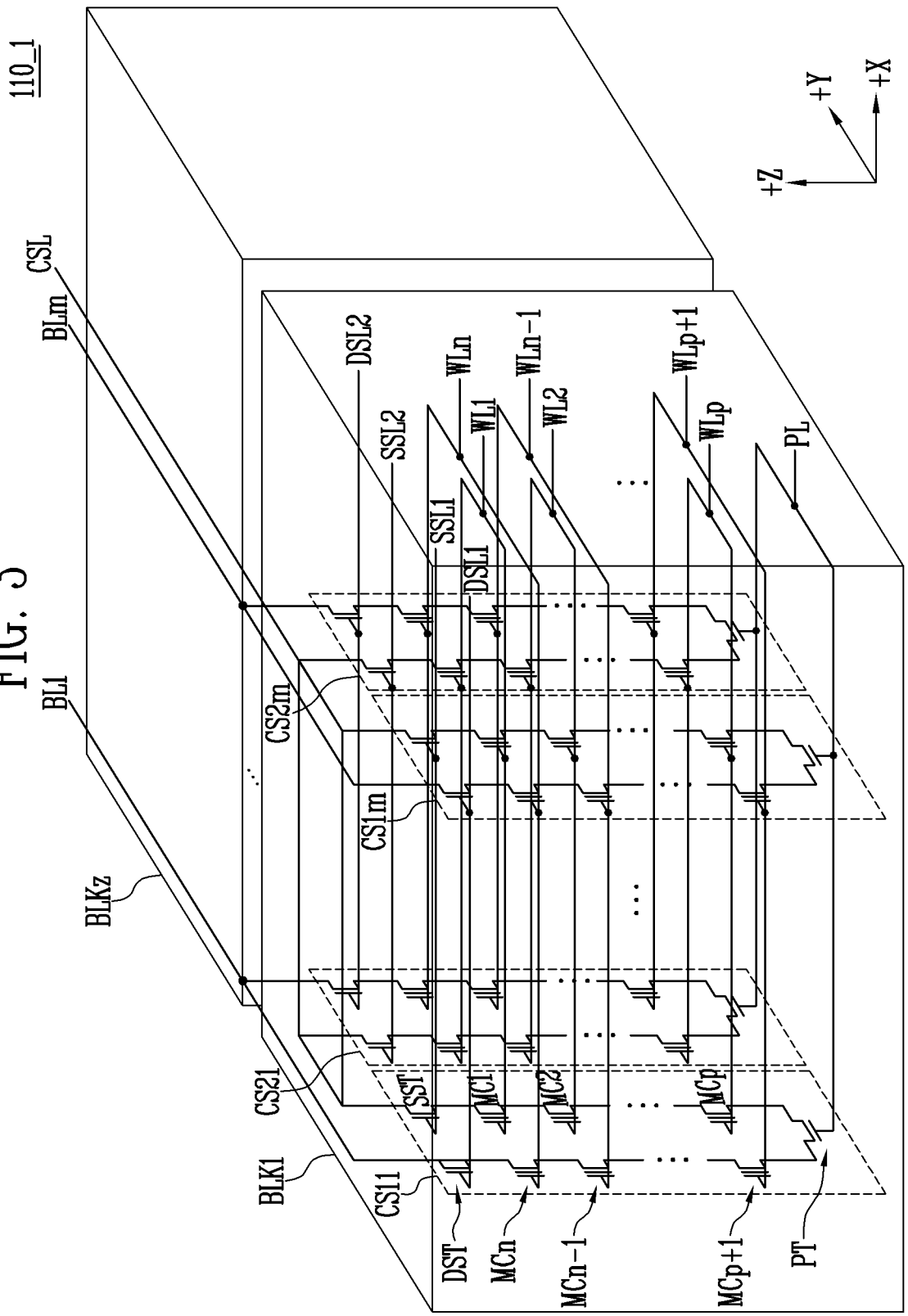
FIG. 3 is a diagram illustrating an embodiment of a memory cell array, such as that of FIG. 1.

FIG. 3 is a diagram illustrating an embodiment 110_1 of the memory cell array 110 of FIG. 1.

Referring to FIG. 3, the memory cell array 110_1 includes a plurality of memory blocks BLK1 to BLKz. In FIG. 3, an internal configuration of the first memory block BLK1, which is representative of each of the other memory blocks BLK2 to BLKz, is shown by way of example. Each of the second to z-th memory blocks BLK2 to BLKz is configured similarly to the first memory block BLK1.

Referring to FIG. 3, the first memory block BLK1 includes a plurality of cell strings CS11 to CS1m and CS21 to CS2m. In an embodiment, each of the plurality of cell strings CS11 to CS1m and CS21 to CS2m may be formed in a 'U' shape. In the first memory block BLK1, m cell strings are arranged in a row direction (that is, the +X direction). In FIG. 3, two cell strings are arranged in a column direction (that is, the +Y direction). However, this is for clarity; three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

Figure 4:
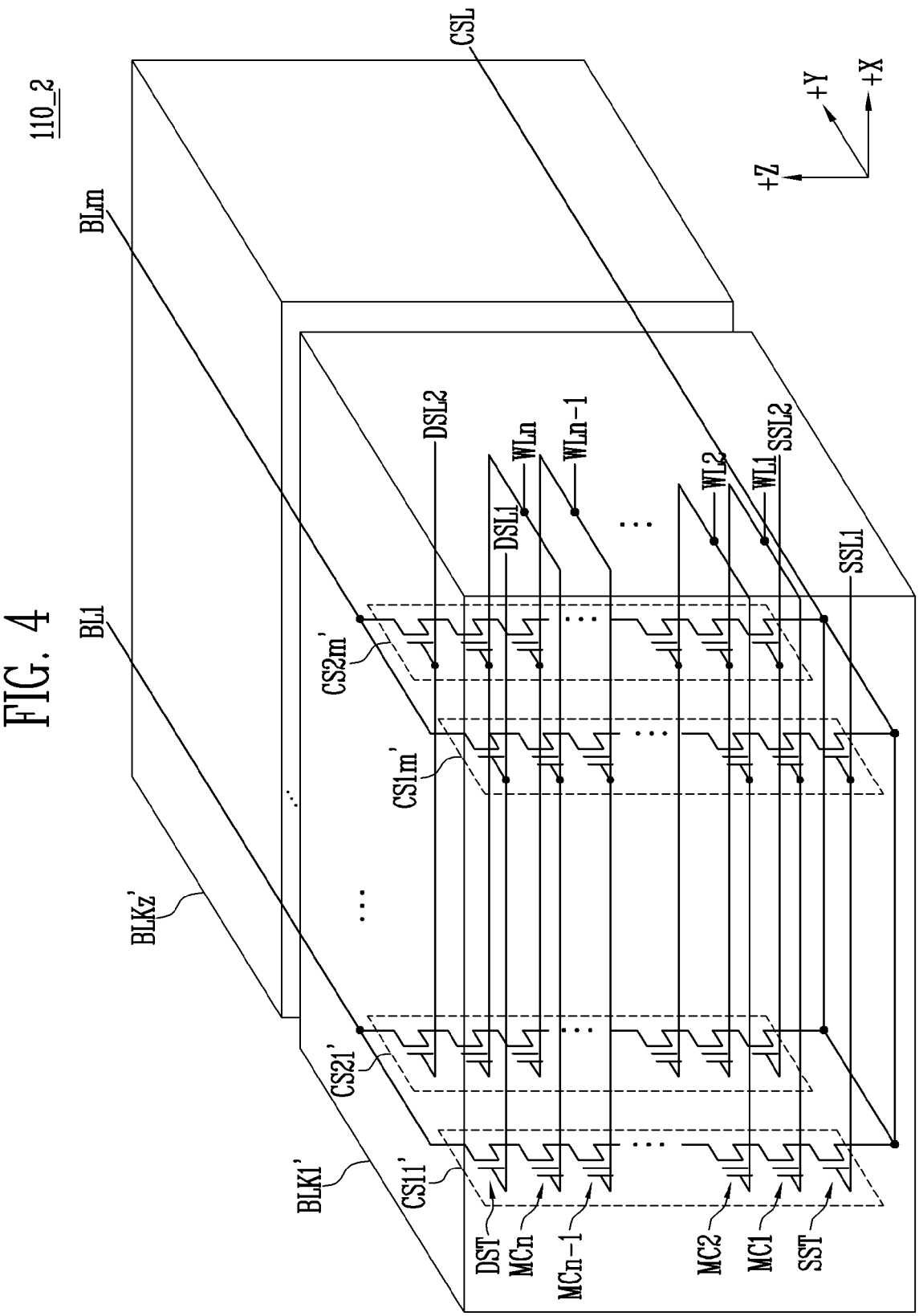
FIG. 4 is a diagram illustrating another embodiment of a memory cell array, such as that of FIG. 1.

In an embodiment, the source select transistors of the cell strings arranged in the same row are connected to one source select line extending in the row direction, and the source select transistors of the cell strings arranged in different rows are connected to different source select lines. In FIG. 4, the source select transistors of the cell strings CS11 to CS1m of a first row are connected to a first source select line SSL1. The source select transistors of the cell strings CS21 to CS2m of a second row are connected to a second source select line SSL2.

In another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a −Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

FIG. 4 is a diagram illustrating another embodiment 110_2 of the memory cell array 110 of FIG. 1.

Referring to FIG. 4, the memory cell array 110_2 includes a plurality of memory blocks BLK1' to BLKz'. In FIG. 4, an internal configuration of the first memory block BLK1', which is representative of each of the other memory blocks BLK2' to BLKz', is shown by way of example. It may be understood that the second to z-th memory blocks BLK2' to BLKz' are configured similarly to the first memory block BLK1'.

The first memory block BLK1' includes a plurality of cell strings CS11' to CS1m' and CS21' to CS2m'. Each of the plurality of cell strings CS11' to CS1m' and CS21' to CS2m' extends along a +Z direction. In the first memory block BLK1, m cell strings are arranged in a +X direction. In FIG. 4, two cell strings are arranged in a +Y direction. However, this is for clarity; three or more cell strings may be arranged in the column direction.

Each of the plurality of cell strings CS11' to CS1m' and CS21' to CS2m' includes at least one source select transistor SST, first to n-th memory cells MC1 to MCn, and at least one drain select transistor DST.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. As another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLK1' of FIG. 4 has an equivalent circuit similar to the memory block BLK1 of FIG. 3 except that the pipe transistor PT is excluded from each cell string.

Figure 5:
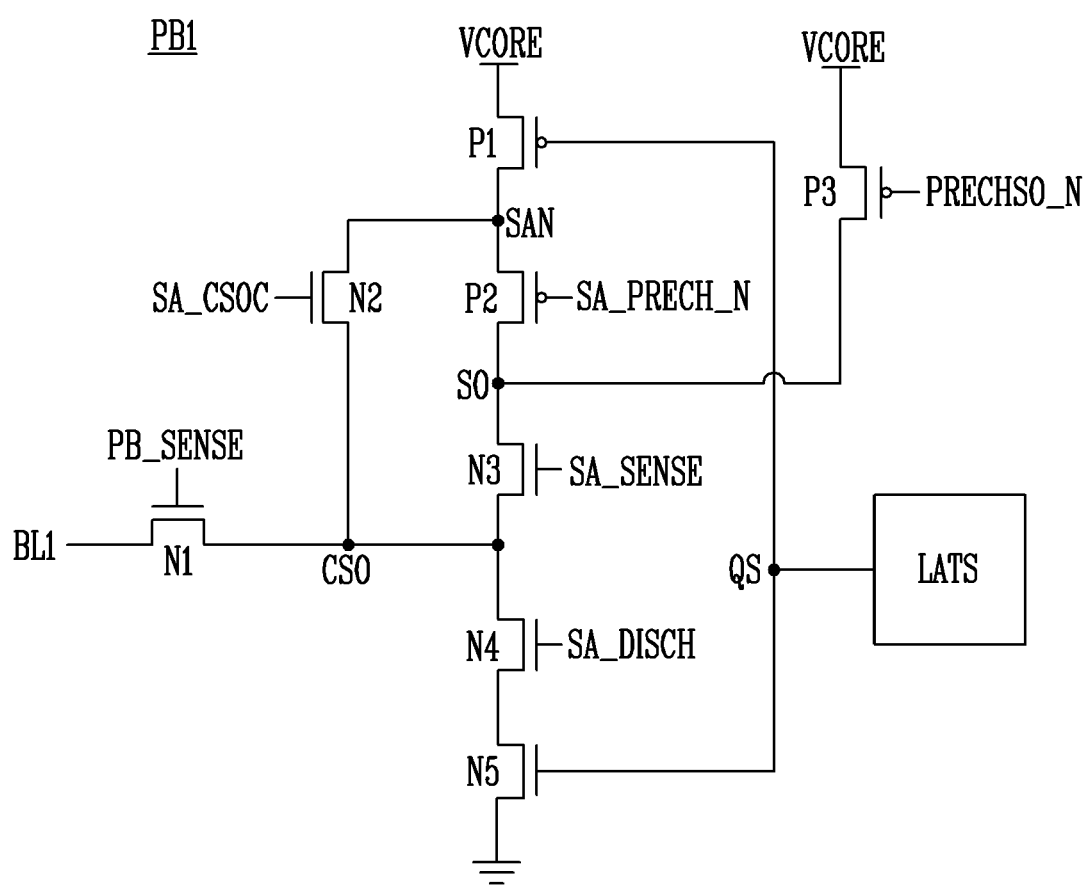
FIG. 5 is a circuit diagram illustrating a page buffer of a semiconductor memory device according to an embodiment of the present disclosure.

FIG. 5 is a circuit diagram illustrating the page buffer PB1 included in the semiconductor memory device 100 according to an embodiment of the present disclosure. PB1 shown in FIG. 5 is representative of any one of the page buffers PB1 to PBm in the read and write circuit 130 of FIG. 1. That is, each of the plurality of page buffers PB1 to PBm in the read and write circuit 130 may be configured similarly; thus, page buffer PB1 is described as an example.

The page buffer PB1 may operate in response to a signal output from the control logic 140. Signals PB_SENSE, SA_PRECH_N, SA_SENSE, SA_CSOC, SA_DISCH, and PRECHSO_N described below may be included in the control signal $CTR_{PB}$ output from the control logic 140.

Referring to FIG. 5, the page buffer PB1 may be connected to the memory cell through the bit line BL1, and may perform a bit line precharge operation of charging a charge supplied from a power voltage VCORE through first to fifth NMOS transistors N1 to N5 and first to third PMOS transistors P1 to P3 to the bit line BL1. In addition, the page buffer PB1 may discharge the charge in the bit line BL1 to a ground voltage through the first NMOS transistor N1, the fourth NMOS transistor N4, and the fifth NMOS transistor N5.

The first NMOS transistor N1 is connected between the bit line BL1 and a common node CSO. The first PMOS transistor P1 is connected between the power voltage VCORE and a sense amplifier node SAN. The second NMOS transistor N2 is connected between the common node CSO and the sense amplifier node SAN. The second PMOS transistor P2 is connected between the sense amplifier node SAN and a sensing node SO. The third NMOS transistor N3 is connected between the sensing node SO and the common node CSO. The third PMOS transistor P3 is connected between the power voltage VCORE and the sensing node SO. The fourth and fifth transistors N4 and N5 are connected in series between the common node CSO and the ground voltage.

The first NMOS transistor N1 is controlled by a page buffer sensing signal PB_SENSE, the second NMOS transistor N2 is controlled by a current sensing signal SA_CSOC, and the third NMOS transistor N3 is controlled by a sense amplifier sensing signal SA_SENSE. In addition, the fourth NMOS transistor N4 is controlled by a sense amplifier discharge signal SA_DISCH, and the fifth NMOS transistor N5 and the first PMOS transistor P1 are controlled by a voltage of a node QS of a sensing latch circuit LATS. The second PMOS transistor P2 is controlled by a sense amplifier precharge signal SA_PRECH_N, and the third PMOS transistor P3 is controlled by a sensing node precharge signal PRECHSO_N. That is, the page buffer sensing signal PB_SENSE is applied to a gate of the first NMOS transistor N1, the current sensing signal SA_CSOC is applied to a gate of the second NMOS transistor N2, and the sense amplifier sensing signal SA_SENSE is applied to a gate of the third NMOS transistor N3. In addition, the sense amplifier discharge signal SA_DISCH is applied to a gate of the fourth NMOS transistor N4, and the voltage of the node QS of the sensing latch circuit LATS is applied to gates of the fifth NMOS transistor N5 and the first PMOS transistor P1. The sense amplifier precharge signal SA_PRECH_N is applied to a gate of the second PMOS transistor P2, and the sensing node precharge signal PRECHSO_N is applied to a gate of the third PMOS transistor P3. Activation voltage level $V_{PB\_SENSE}$ of the page buffer sensing signal PB_SENSE electrically couples the bit line BL1 and the common node CSO. An activation voltage level $V_{SA\_CSOC}$ of the current sensing signal SA_CSOC may maintain the voltage level of the common node CSO. Activation voltage level $V_{SA\_SENSE}$ of the sense amplifier sensing signal SA_SENSE electrically couples the common node CSO and the sensing node SO. A voltage level of the sensing node SO is latched by the sensing latch circuit LATS. The activation voltage levels (or activation voltages) $V_{PB\_SENSE}$, $V_{SA\_CSOC}$ and $V_{SA\_SENSE}$ are described in more detail below.

The sensing latch circuit LATS may include a latch configured of two inverters (not shown) connected to the node QS, and a reset transistor (not shown) and a set transistor (not shown) for controlling the voltage of the node QS. Since such structure of the sensing latch circuit LATS is widely known, detailed configuration thereof is omitted in FIG. 5. The sensing latch circuit LATS may control the bit line precharge operation by turning on or turning off the first PMOS transistor P1 through the voltage of the node QS.

During a sensing operation on the memory cell, a voltage of the sensing node SO is determined based on a threshold voltage of the memory cell MC. For example, a voltage of the bit line BL1 may be determined based on a threshold voltage of a selected memory cell. When the first NMOS transistor N1 and the third NMOS transistor N3 are turned on, the bit line BL1 and the sensing node SO are electrically connected to each other through the common node CSO, and thus the voltage of the sensing node SO may be determined based on the threshold voltage of the selected memory cell. The sensing latch circuit LATS may store a result of sensing the threshold voltage of the memory cell. More specifically, the sensing latch circuit LATS may latch data corresponding to a potential level of the sensing node SO.

According to an embodiment of the present disclosure, during the read operation or the program verify operation, the page buffer sensing signal PB_SENSE applied to the first NMOS transistor N1 may be adjusted according to the temperature of the semiconductor memory device 100. In this specification, the "activation voltage" of a control signal may mean a voltage level corresponding to the logic high state of the control signal. For example, the activation voltage of the page buffer sensing signal PB_SENSE may be a relatively high voltage level of the page buffer sensing signal PB_SENSE for turning on the first NMOS transistor. In contrast to this, the "deactivation voltage" of a control signal may mean a voltage level corresponding to a logic low state of the control signal. For example, the deactivation voltage of the page buffer sensing signal PB_SENSE may be a relatively low voltage level (e.g. a ground voltage) of the page buffer sensing signal PB_SENSE for turning off the first NMOS transistor. More specifically, during the bit line precharge operation in the read operation or the program verify operation, an activation voltage of the page buffer sensing signal PB_SENSE applied to the first NMOS transistor N1 may be adjusted according to the temperature of the semiconductor memory device 100. For example, as the temperature of the semiconductor memory device 100 decreases, the activation voltage of the page buffer sensing signal PB_SENSE applied to the first NMOS transistor N1 may be increased to a relatively high level. Similarly, as the temperature of the semiconductor memory device 100 increases, the activation voltage of the page buffer sensing signal PB_SENSE applied to the first NMOS transistor N1 may be decreased to a relatively low level.

According to an embodiment of the present disclosure, during the read operation or the program verify operation, the current sensing signal SA_CSOC applied to the second NMOS transistor N2 may be adjusted according to the temperature of the semiconductor memory device 100. More specifically, during the bit line precharge operation in the read operation or the program verify operation, an activation voltage of the current sensing signal SA_CSOC applied to the second NMOS transistor N2 may be adjusted according to the temperature of the semiconductor memory device 100. For example, as the temperature of the semiconductor memory device 100 decreases, the activation voltage of the current sensing signal SA_CSOC applied to the second NMOS transistor N2 may be increased to a relatively high level. Similarly, as the temperature of the semiconductor memory device 100 increases, the activation voltage of the current sensing signal SA_CSOC applied to the second NMOS transistor N2 may be decreased to a relatively low level.

Figure 6:
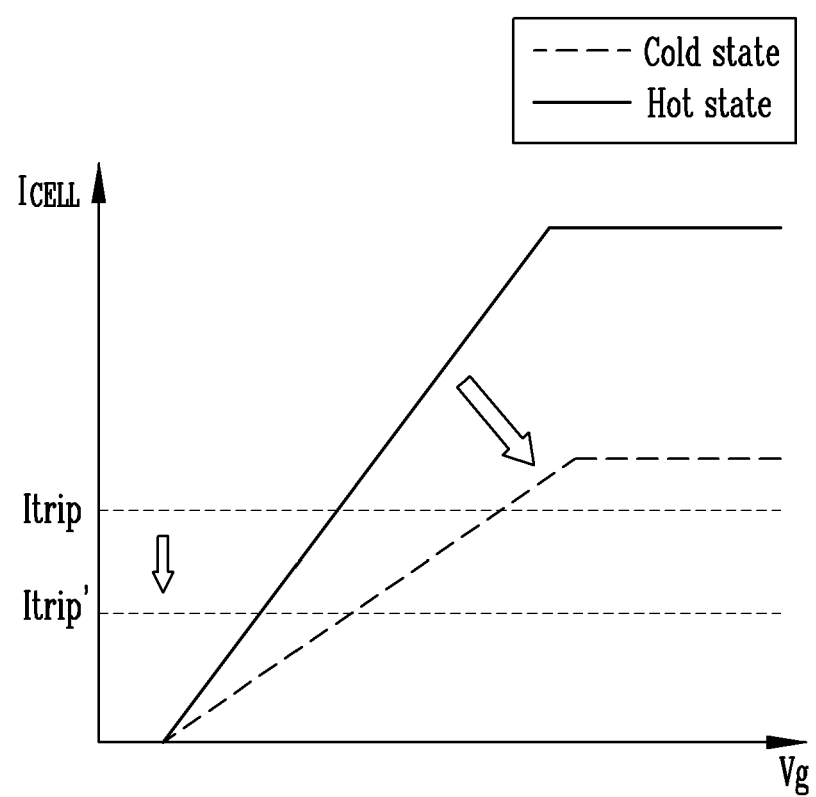
FIG. 6 is a graph illustrating an operation characteristic of a memory cell according to temperature.

FIG. 6 is a graph illustrating an operation characteristic of the memory cell according to the temperature. Referring to FIG. 6, a relationship between a gate voltage Vg and a cell current $I_{CELL}$ according to the temperature of the semiconductor memory device during the read operation or the program verify operation of the selected memory cell is shown.

As shown in FIG. 6, at the same gate voltage Vg, the amount of cell current $I_{CELL}$ flowing through the memory cell is large when the temperature of the semiconductor memory device 100 is high and is small when the temperature of the semiconductor memory device 100 is low. This means that the amount of a reference current Itrip may vary as the temperature of the semiconductor memory device 100 varies between a high current (Hot state) and low current (Cold state).

According to an embodiment of the present disclosure, in order to compensate for a characteristic of the memory cell according to the temperature change, during the read operation or the program verify operation, the activation voltage of the page buffer sensing signal PB_SENSE and the activation voltage of the current sensing signal SA_CSOC among the control signals $CTR_{PB}$ applied to the page buffer may be determined based on the temperature. That is, as the temperature of the semiconductor memory device 100 decreases, the activation voltage of the page buffer sensing signal PB_SENSE applied to the first NMOS transistor N1 and the activation voltage of the current sensing signal SA_CSOC applied to the second NMOS transistor N2 may be increased to a relatively high level. Similarly, as the temperature of the semiconductor memory device 100 increases, the activation voltage of the page buffer sensing signal PB_SENSE applied to the first NMOS transistor N1 and the activation voltage of the current sensing signal SA_CSOC applied to the second NMOS transistor N2 may be decreased to a relatively low level. Accordingly, a change of the current flowing through the memory cell may be compensated as the temperature changes. Therefore, read performance or program verify performance of the semiconductor memory device may be improved.

Figure 7:
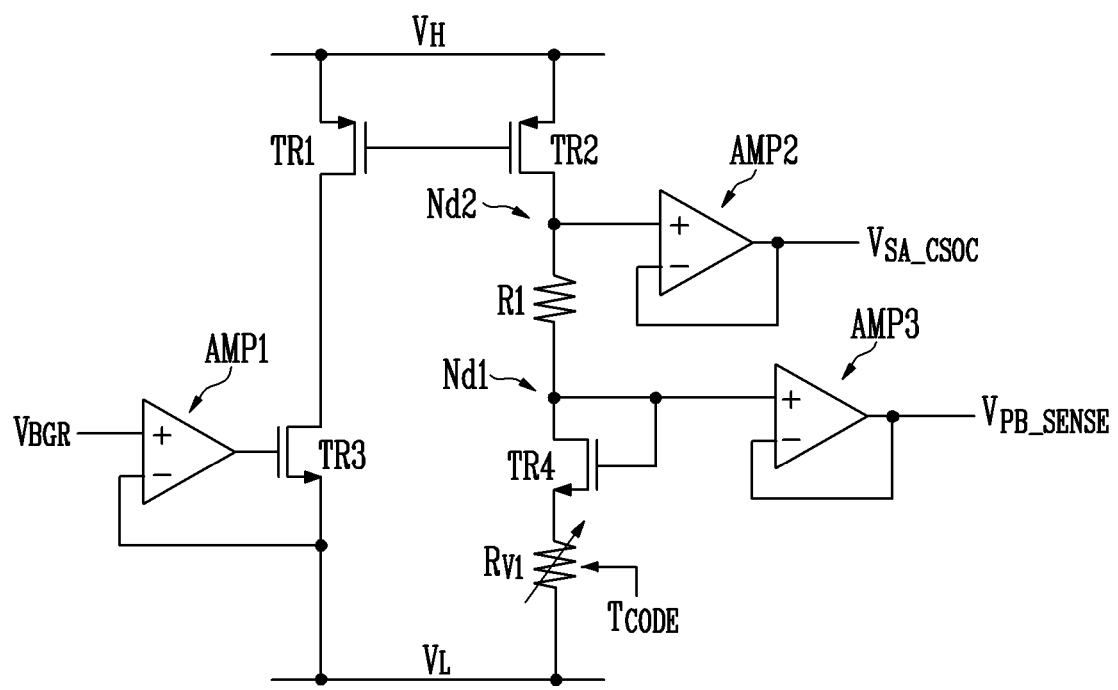
FIG. 7 is a circuit diagram illustrating a voltage generator generating an activation voltage of a page buffer sensing signal and an activation voltage of a current sensing signal according to an embodiment of the present disclosure.

FIG. 7 is a circuit diagram illustrating a voltage generator 150*a* generating the activation voltage of the page buffer sensing signal PB_SENSE and the activation voltage of the current sensing signal SA_CSOC according to an embodiment of the present disclosure. The voltage generator 150*a* shown in FIG. 7 is an example of the voltage generator 150 shown in FIG. 1.

Referring to FIG. 7, the voltage generator 150*a* may include transistors TR1, TR2, TR3, and TR4, operational amplifiers AMP1, AMP2, and AMP3, and resistors R1 and $R_{V1}$. The transistors TR1 and TR3 are connected in series between a high voltage $V_H$ and a low voltage $V_L$. The transistor TR2, the resistor R1, the transistor TR4, and the resistor RV1 are connected in series between the high voltage $V_H$ and the low voltage $V_L$. The transistors TR1 and TR2 may be PMOS transistors, and the transistors TR3 and TR4 may be NMOS transistors. An output terminal of the operational amplifier AMP1 is connected to a gate terminal of the transistor TR3. In addition, an inverting input terminal of the operational amplifier AMP1 is connected to the low voltage $V_L$. A bandgap reference voltage $V_{BGR}$ is input to a non-inverting input terminal of the operational amplifier AMP1. The bandgap reference voltage $V_{BGR}$ is insensitive to temperature change and may be generated by a bandgap reference voltage generation circuit. The bandgap reference voltage generation circuit may generate the temperature insensitive bandgap reference voltage $V_{BGR}$ by appropriately combining a voltage proportional to absolute temperature (PTAT) and a voltage complementary to absolute temperature (CTAT). The bandgap reference voltage generation circuit may also be included in the voltage generator 150*a*.

A non-inverting input terminal of the operational amplifier AMP3 is connected to a node Nd1 to which the resistor R1 and the transistor TR4 are connected. An inverting input terminal of the operational amplifier AMP3 is connected to an output terminal of the operational amplifier AMP3. A non-inverting input terminal of the operational amplifier AMP2 is connected to a node Nd2 to which the resistor R1 and the transistor TR2 are connected. An inverting input terminal of the operational amplifier AMP2 is connected to an output terminal of the operational amplifier AMP2. That is, the operational amplifiers AMP2 and AMP3 may be a buffer circuit having a gain of 1.

The transistors TR1, TR2, and TR3 may form a current mirror. Since the bandgap reference voltage $V_{BGR}$ is insensitive to temperature change, a constant current may flow through the transistor TR2 even though the high voltage $V_H$ and the low voltage $V_L$ somewhat change according to temperature.

The resistor R1 may be a fixed-value resistor, and the resistor $R_{V1}$ may be a variable resistor. More specifically, a resistance value of the resistor $R_{V1}$ may vary according to the temperature code $T_{CODE}$ received from the temperature sensor 160. For example, when the temperature code $T_{CODE}$ indicates a high temperature, the value of the resistor $R_{V1}$ may decrease, and when the temperature code $T_{CODE}$ indicates a low temperature, the value of the resistance $R_{V1}$ may increase.

When the value of the resistor $R_{V1}$ decreases, the activation voltage $V_{PB\_SENSE}$ of the page buffer sensing signal PB_SENSE output from the operational amplifier AMP3 may also decrease. Similarly, when the value of the resistor $R_{V1}$ decreases, the activation voltage $V_{SA\_CSOC}$ of the current sensing signal SA_CSOC output from the operational amplifier AMP2 may also decrease.

That is, when the temperature of the semiconductor memory device 100 increases, the value of the resistor $R_{V1}$ may decrease, and thus the activation voltage $V_{PB\_SENSE}$ of the page buffer sensing signal PB_SENSE and the activation voltage $V_{SA\_CSOC}$ of the current sensing signal SA_CSOC may decrease.

Conversely, when the temperature of the semiconductor memory device 100 decreases, the value of the resistor $R_{V1}$ may increase, and thus the activation voltage $V_{PB\_SENSE}$ of the page buffer sensing signal PB_SENSE and the activation voltage $V_{SA\_CSOC}$ of the current sensing signal SA_CSOC may increase.

According to the circuit diagram shown in FIG. 7, the activation voltage $V_{SA\_CSOC}$ of the current sensing signal SA_CSOC is greater than the activation voltage $V_{PB\_SENSE}$ of the page buffer sensing signal PB_SENSE according to a voltage distribution principle.

Figure 8:
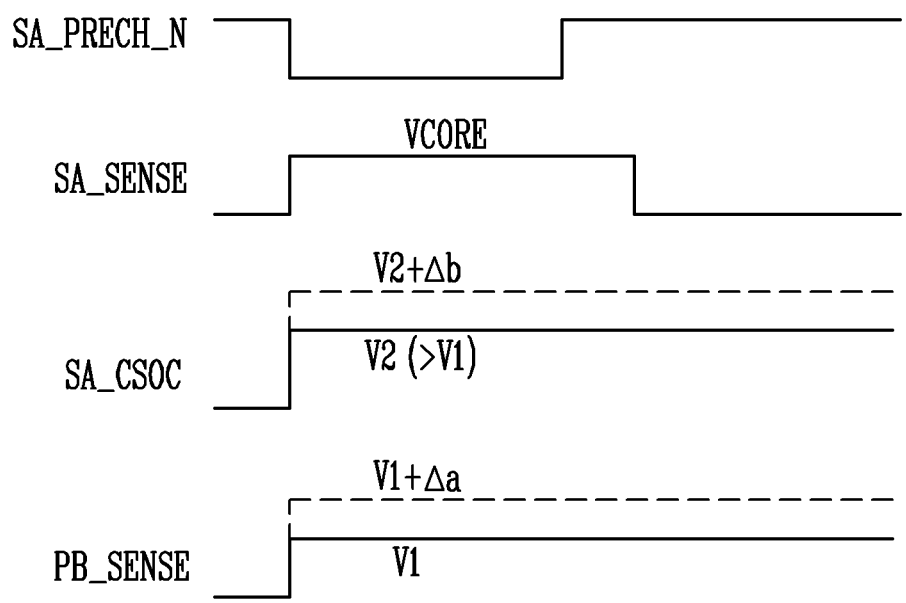
FIG. 8 is a timing diagram illustrating control signals of a semiconductor memory device according to an embodiment of the present disclosure.

FIG. 8 is a timing diagram illustrating the control signals $CTR_{PB}$ of the semiconductor memory device according to an embodiment of the present disclosure. As described above, the control signals $CTR_{PB}$ output from the control logic 140 and applied to the page buffers PB1 to PBm include the sense amplifier precharge signal SA_PRECH_N, the sense amplifier sensing signal SA_SENSE, the current sensing signal SA_CSOC, and the page buffer sensing signal PB_SENSE.

The activation voltage of the sense amplifier sensing signal SA_SENSE may be the power voltage VCORE. When the temperature of the semiconductor memory device 100 is relatively high, the activation voltage of the page buffer sensing signal PB_SENSE may be a first voltage V1, and the activation voltage of the current sensing signal SA_CSOC may be a second voltage V2. The first voltage V1 may be the activation voltage $V_{PB\_SENSE}$ of the page buffer sensing signal PB_SENSE output by the voltage generator 150a of FIG. 7 when the semiconductor memory device 100 is in the high temperature state. In addition, the second voltage V2 may be the activation voltage $V_{SA\_CSOC}$ of the current sensing signal SA_CSOC output by the voltage generator 150a of FIG. 7 when the semiconductor memory device 100 is in the high temperature state. As described above, the activation voltage $V_{SA\_CSOC}$ of the current sensing signal SA_CSOC is greater than the activation voltage $V_{PB\_SENSE}$ of the page buffer sensing signal PB_SENSE according to the voltage distribution principle. Therefore, the second voltage V2 may be greater than the first voltage V1.

When the temperature of the semiconductor memory device 100 changes from a relatively high temperature to a relatively low temperature, the activation voltage of the page buffer sensing signal PB_SENSE may be obtained by increasing the first voltage V1 by a first deviation Δa. In addition, when the temperature of the semiconductor memory device 100 changes from a relatively high temperature to a relatively low temperature, the activation voltage of the current sensing signal SA_CSOC may be obtained by increasing the second voltage V2 by a second deviation Δb. As described above with reference to FIG. 7, when the temperature of the semiconductor memory device 100 decreases, the value of the resistor $R_{V1}$ may increase, and thus the activation voltage $V_{PB\_SENSE}$ of the page buffer sensing signal PB_SENSE and the activation voltage $V_{SA\_CSOC}$ of the current sensing signal SA_CSOC may increase.

According to the embodiment shown in FIGS. 7 and 8, when the temperature changes, the activation voltage $V_{PB\_SENSE}$ of the page buffer sensing signal PB_SENSE and the activation voltage $V_{SA\_CSOC}$ of the current sensing signal SA_CSOC change while the activation voltage of the sense amplifier sensing signal SA_SENSE is fixed to the power voltage VCORE. For stable operation of the page buffer PB1, an activation voltage of the sense amplifier sensing signal SA_SENSE is designed to be greater than an activation voltage of the current sensing signal SA_CSOC. When the activation voltage of the current sensing signal SA_CSOC increases as the temperature of the semiconductor memory device 100 decreases, a margin between the activation voltage of the sense amplifier sensing signal SA_SENSE and the activation voltage of the current sensing signal SA_CSOC is decreased. When such margin is not sufficiently secured, operation stability of the page buffer PB1 may be reduced.

According to another embodiment of the present disclosure, the activation voltage of the sense amplifier sensing signal SA_SENSE may be adjusted together with the activation voltage of the current sensing signal SA_CSOC according to the temperature change of the semiconductor memory device 100. That is, when the activation voltage of the current sensing signal SA_CSOC increases as the temperature of the semiconductor memory device 100 decreases, the activation voltage of the sense amplifier sensing signal SA_SENSE may also increase. Accordingly, even when the activation voltage of the current sensing signal SA_CSOC increases to compensate for a change of a current flowing through the memory cell as the temperature of the semiconductor memory device 100 changes, the margin between the activation voltage of the sense amplifier sensing signal SA_SENSE and the activation voltage of the current sensing signal SA_CSOC may be sufficiently secured. Therefore, the operation stability of the page buffer PB1 may be improved.

Figure 9:
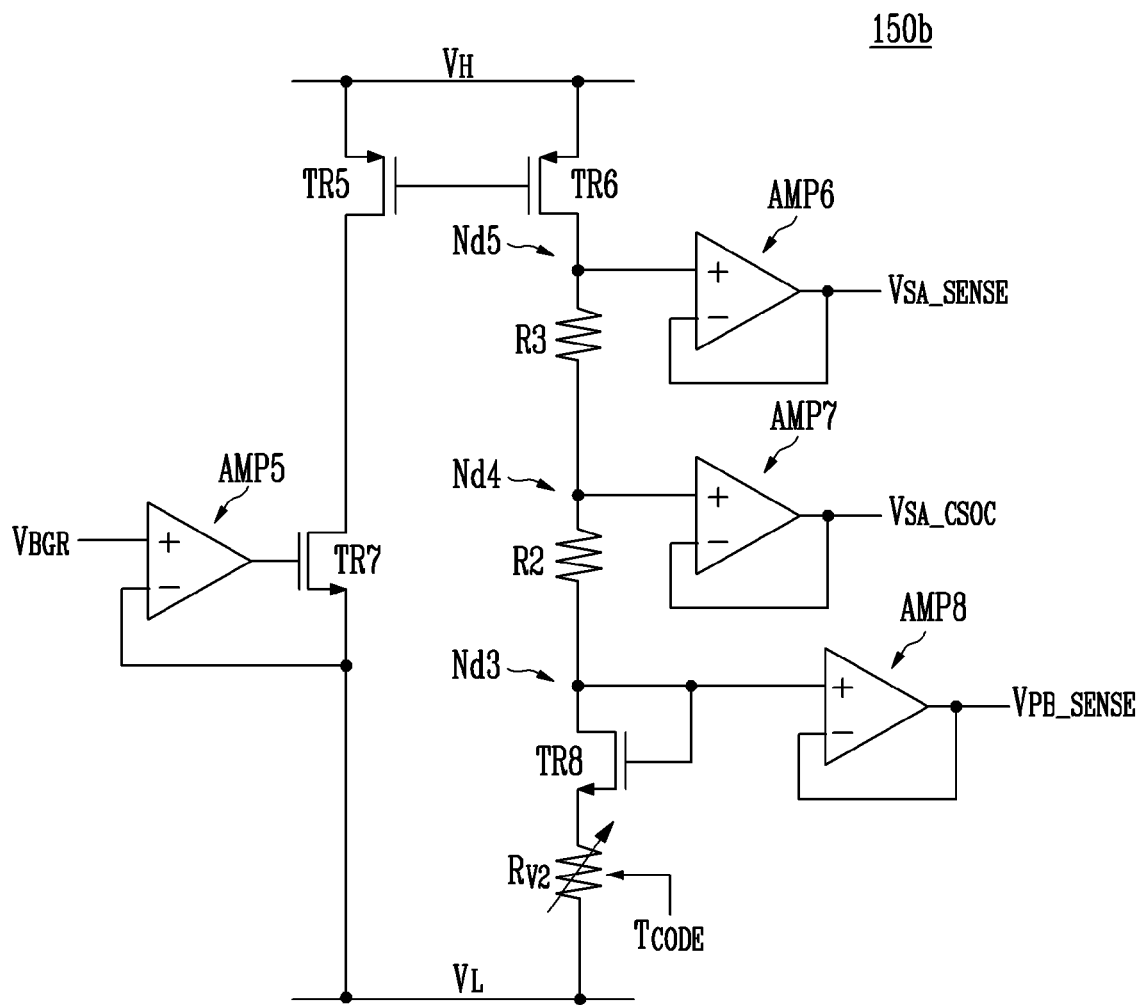
FIG. 9 is a circuit diagram illustrating a voltage generator generating an activation voltage of a page buffer sensing signal, an activation voltage of a current sensing signal, and an activation voltage of a sense amplifier sensing signal according to an embodiment of the present disclosure.

FIG. 9 is a circuit diagram illustrating a voltage generator 150b generating the activation voltage of the page buffer sensing signal PB_SENSE, the activation voltage of the current sensing signal SA_CSOC, and the activation voltage of the sense amplifier sensing signal SA_SENSE according to an embodiment of the present disclosure. The voltage generator 150b shown in FIG. 9 is an example of the voltage generator 150 shown in FIG. 1.

Referring to FIG. 9, the voltage generator 150b may include transistors TR5, TR6, TR7, and TR8, operational amplifiers AMP5, AMP6, AMP7, and AMP8 and resistors R3, R2, and $R_{V2}$. The transistors TR5 and TR7 are connected in series between a high voltage $V_H$ and a low voltage $V_L$. The transistor TR6, the resistor R2, the resistor R3, the transistor TR8, and the resistor $R_{V2}$ are connected in series between the high voltage $V_H$ and the low voltage $V_L$. The transistors TR5 and TR6 may be PMOS transistors, and the transistors TR7 and TR8 may be NMOS transistors. An output terminal of the operational amplifier AMP5 is connected to a gate terminal of the transistor TR7. In addition, an inverting input terminal of the operational amplifier AMP5 is connected to the low voltage $V_L$. A bandgap reference voltage $V_{BGR}$ is input to a non-inverting input terminal of the operational amplifier AMP5. The bandgap reference voltage $V_{BGR}$ is insensitive to temperature change and may be generated by a bandgap reference voltage generation circuit. The bandgap reference voltage generation circuit may generate the temperature insensitive bandgap reference voltage $V_{BGR}$ by appropriately combining a voltage proportional to absolute temperature (PTAT) and a voltage complementary to absolute temperature (CTAT). The bandgap reference voltage generation circuit may also be included in the voltage generator 150b.

A non-inverting input terminal of the operational amplifier AMP8 is connected to a node Nd3 to which the resistor R2 and the transistor TR8 are connected. An inverting input terminal of the operational amplifier AMP8 is connected to an output terminal of the operational amplifier AMP8. A non-inverting input terminal of the operational amplifier AMP7 is connected to a node Nd4 to which the resistor R2 and the resistor R3 are connected. An inverting input terminal of the operational amplifier AMP7 is connected to an output terminal of the operational amplifier AMP7. A non-inverting input terminal of the operational amplifier AMP6 is connected to a node Nd5 to which the resistor R3 and the transistor TR6 are connected. An inverting input terminal of the operational amplifier AMP6 is connected to an output terminal of the operational amplifier AMP6. That is, the operational amplifiers AMP6, AMP7, and AMP8 may be a buffer circuit having a gain of 1.

The transistors TR5, TR6, and TR7 may form a current mirror. Since the bandgap reference voltage $V_{BGR}$ is insensitive to temperature change, a constant current may flow through the transistor TR6 even though the high voltage $V_H$ and the low voltage $V_L$ somewhat change according to the temperature.

The resistors R2 and R3 may be fixed-value resistors, and the resistor $R_{V2}$ may be a variable resistor. More specifically, a resistance value of the resistor $R_{V2}$ may vary according to the temperature code $T_{CODE}$ received from the temperature sensor 160. For example, when the temperature code $T_{CODE}$ indicates a high temperature, the value of the resistor $R_{V2}$ may decrease, and when the temperature code $T_{CODE}$ indicates a low temperature, the value of the resistor $R_{V2}$ may increase.

When the value of the resistor $R_{V2}$ decreases, the activation voltage $V_{PB\_SENSE}$ of the page buffer sensing signal PB_SENSE output from the operational amplifier AMP8 may also decrease. Similarly, when the value of the resistor $R_{V2}$ decreases, the activation voltage $V_{SA\_CSOC}$ of the current sensing signal SA_CSOC output from the operational amplifier AMP7 may also decrease. When the value of the resistor $R_{V2}$ decreases, the activation voltage $V_{SA\_SENSE}$ of the sense amplifier sensing signal SA_SENSE output from the operational amplifier AMP6 may also decrease.

That is, when the temperature of the semiconductor memory device 100 increases, the value of the resistor $R_{V2}$ may decrease, and thus the activation voltage $V_{PB\_SENSE}$ of the page buffer sensing signal PB_SENSE, the activation voltage $V_{SA\_CSOC}$ of the current sensing signal SA_CSOC, and the activation voltage $V_{SA\_SENSE}$ of the sense amplifier sensing signal SA_SENSE may decrease.

Conversely, when the temperature of the semiconductor memory device 100 decreases, the value of the resistor $R_{V2}$ may increase, and thus the activation voltage $V_{PB\_SENSE}$ of the page buffer sensing signal PB_SENSE, the activation voltage $V_{SA\_CSOC}$ of the current sensing signal SA_CSOC, and the activation voltage $V_{SA\_SENSE}$ of the sense amplifier sensing signal SA_SENSE may increase.

According to the circuit diagram shown in FIG. 9, the activation voltage $V_{SA\_CSOC}$ of the current sensing signal SA_CSOC is greater than the activation voltage $V_{PB\_SENSE}$ of the page buffer sensing signal PB_SENSE, and the activation voltage $V_{SA\_SENSE}$ of the sense amplifier sensing signal SA_SENSE is greater than the activation voltage $V_{SA\_CSOC}$ of the current sensing signal SA_CSOC, according to a voltage distribution principle. According to the circuit diagram shown in FIG. 9, an embodiment including only one variable resistor is shown, but the present disclosure is not limited thereto. For example, at least one of the resistor R2 or the resistor R3 may be configured as a variable resistor. In such an embodiment, when the temperature code $T_{CODE}$ indicates a high temperature, a value of the variable resistor replacing R2 or R3 may decrease, and when the temperature code $T_{CODE}$ indicates a low temperature, the value of the variable resistor replacing R2 or R3 may increase.

Figure 10:
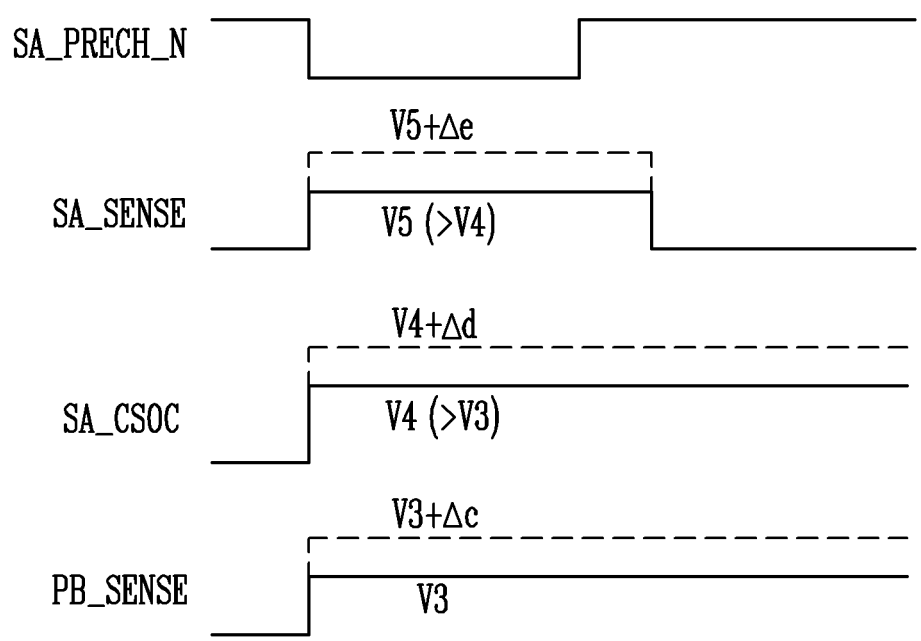
FIG. 10 is a timing diagram illustrating control signals of a semiconductor memory device according to an embodiment of the present disclosure.

FIG. 10 is a timing diagram illustrating the control signals $CTR_{PB}$ of the semiconductor memory device according to an embodiment of the present disclosure. As described above, the control signals $CTR_{PB}$ output from the control logic 140 and applied to the page buffers PB1 to PBm include the sense amplifier precharge signal SA_PRECH_N, the sense amplifier sensing signal SA_SENSE, the current sensing signal SA_CSOC, and the page buffer sensing signal PB_SENSE.

When the semiconductor memory device 100 is in a relatively high temperature state, the activation voltage of the page buffer sensing signal PB_SENSE may be a third voltage V3, and the activation voltage of the current sensing signal SA_CSOC may be a fourth voltage V4. The activation voltage of the sense amplifier sensing signal SA_SENSE may be a fifth voltage V5. The third voltage V3 may be the activation voltage $V_{PB\_SENSE}$ of the page buffer sensing signal PB_SENSE output by the voltage generator 150b of FIG. 9 in the state in which the semiconductor memory device 100 is in the high temperature. The fourth voltage V4 may be the activation voltage $V_{SA\_CSOC}$ of the current sensing signal SA_CSOC output by the voltage generator 150b of FIG. 9 when the semiconductor memory device 100 is in the high temperature state. The fifth voltage V5 may be the activation voltage $V_{SA\_SENSE}$ of the sense amplifier sensing signal SA_SENSE output by the voltage generator 150b of FIG. 9 in the state in which the semiconductor memory device 100 is in the high temperature. As described above, the activation voltage $V_{SA\_CSOC}$ of the current sensing signal SA_CSOC is greater than the activation voltage $V_{PB\_SENSE}$ of the page buffer sensing signal PB_SENSE, and the activation voltage $V_{SA\_SENSE}$ of the sense amplifier sensing signal SA_SENSE is greater than the activation voltage $V_{SA\_CSOC}$ of the current sensing signal SA_CSOC, according to the voltage distribution principle. Therefore, the fourth voltage V4 may be greater than the third voltage V3, and the fifth voltage V5 may be greater than the fourth voltage V4.

When the temperature of the semiconductor memory device 100 changes from a relatively high temperature to a relatively low temperature, the activation voltage of the page buffer sensing signal PB_SENSE may be obtained by increasing the third voltage V3 by a third deviation $\Delta c$. In addition, when the temperature of the semiconductor memory device 100 changes from the relatively high temperature to the relatively low temperature, the activation voltage of the current sensing signal SA_CSOC may be obtained by increasing the fourth voltage V4 by a fourth deviation $\Delta d$. When the temperature of the semiconductor memory device 100 changes from the relatively high temperature to the relatively low temperature, the activation voltage of the sense amplifier sensing signal SA_SENSE may be obtained by increasing the fifth voltage V5 by a fifth deviation $\Delta e$. As described above with reference to FIG. 9, when the temperature of the semiconductor memory device 100 decreases, the value of the resistor $R_{V2}$ may increase, and thus the activation voltage $V_{PB\_SENSE}$ of the page buffer sensing signal PB_SENSE, the activation voltage $V_{SA\_CSOC}$ of the current sensing signal SA_CSOC, and the activation voltage $V_{SA\_SENSE}$ of the sense amplifier sensing signal SA_SENSE may increase.

According to the embodiment shown in FIGS. 9 and 10, the activation voltage of the sense amplifier sensing signal SA_SENSE may be adjusted together with the activation voltage of the current sensing signal SA_CSOC according to the temperature change of the semiconductor memory device 100. That is, when the activation voltage of the current sensing signal SA_CSOC increases as the temperature of the semiconductor memory device 100 decreases, the activation voltage of the sense amplifier sensing signal SA_SENSE may also increase. Accordingly, even when the activation voltage of the current sensing signal SA_CSOC increases to compensate for a change of a current flowing through the memory cell as the temperature of the semiconductor memory device 100 changes, the margin value between the activation voltage of the sense amplifier sensing signal SA_SENSE and the activation voltage of the current sensing signal SA_CSOC may be sufficiently secured. Therefore, the operation stability of the page buffer PB1 may be improved.

Figure 11:
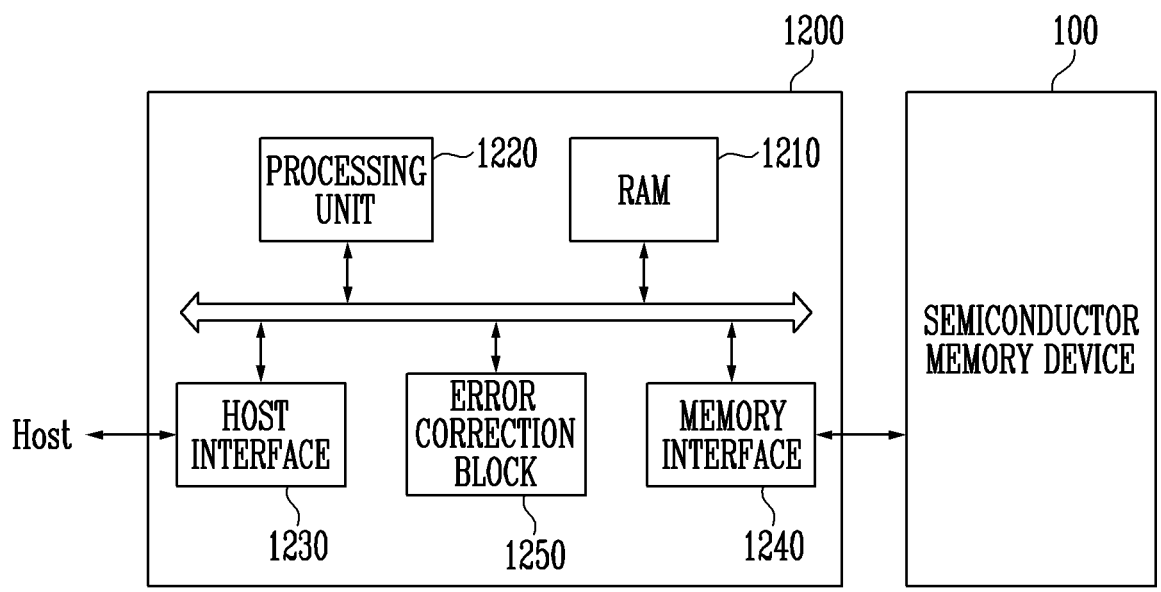
FIG. 11 is a block diagram illustrating a memory system including a semiconductor memory device, such as that of FIG. 1.

FIG. 11 is a block diagram illustrating a memory system 1000 including the semiconductor memory device 100 of FIG. 1.

Referring to FIG. 11, the memory system 1000 includes the semiconductor memory device 100 and a controller 1200.

The semiconductor memory device 100 may be configured and operate as described with reference to FIG. 1. Thus, the semiconductor memory device 100 is not described again here.

The controller 1200 is connected to a host (Host) and the semiconductor memory device 100. The controller 1200 is configured to access the semiconductor memory device 100 in response to a request from the host. For example, the controller 1200 is configured to control read, write, erase, and background operations of the semiconductor memory device 100. The controller 1200 is configured to provide an interface between the semiconductor memory device 100 and the host. The controller 1200 is configured to drive firmware for controlling the semiconductor memory device 100.

The controller 1200 includes a random access memory (RAM) 1210, a processing unit 1220, a host interface 1230, a memory interface 1240, and an error correction block 1250. The RAM 1210 is used as at least one of an operation memory of the processing unit 1220, a cache memory between the semiconductor memory device 100 and the host, and a buffer memory between the semiconductor memory device 100 and the host. The processing unit 1220 controls overall operation of the controller 1200.

The host interface 1230 includes a protocol for performing data exchange between the host and the controller 1200. In an embodiment, the controller 1200 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and/or a private protocol.

The memory interface 1240 interfaces with the semiconductor memory device 100. For example, the memory interface includes a NAND interface or a NOR interface.

The error correction block 1250 is configured to detect and correct an error of data received from the semiconductor memory device 100 using an error correcting code (ECC).

The controller 1200 and the semiconductor memory device 100 may be integrated into one semiconductor device. In an embodiment, the controller 1200 and the semiconductor memory device 100 may be integrated into one semiconductor device to configure a memory card, such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and/or a universal flash storage (UFS).

The controller 1200 and the semiconductor memory device 100 may be integrated into one semiconductor device to configure a semiconductor drive (solid state drive (SSD)). The semiconductor drive (SSD) includes a storage device configured to store data in the semiconductor memory. When the memory system 1000 is used as the semiconductor drive (SSD), operation speed of the host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the semiconductor memory device 100 or the memory system 1000 may be mounted as a package of any of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a system in package (SIP), a multi-chip package (MCP), a wafer-level fabricated package (WFP), or a wafer-level processed stack package (WSP).

Figure 12:
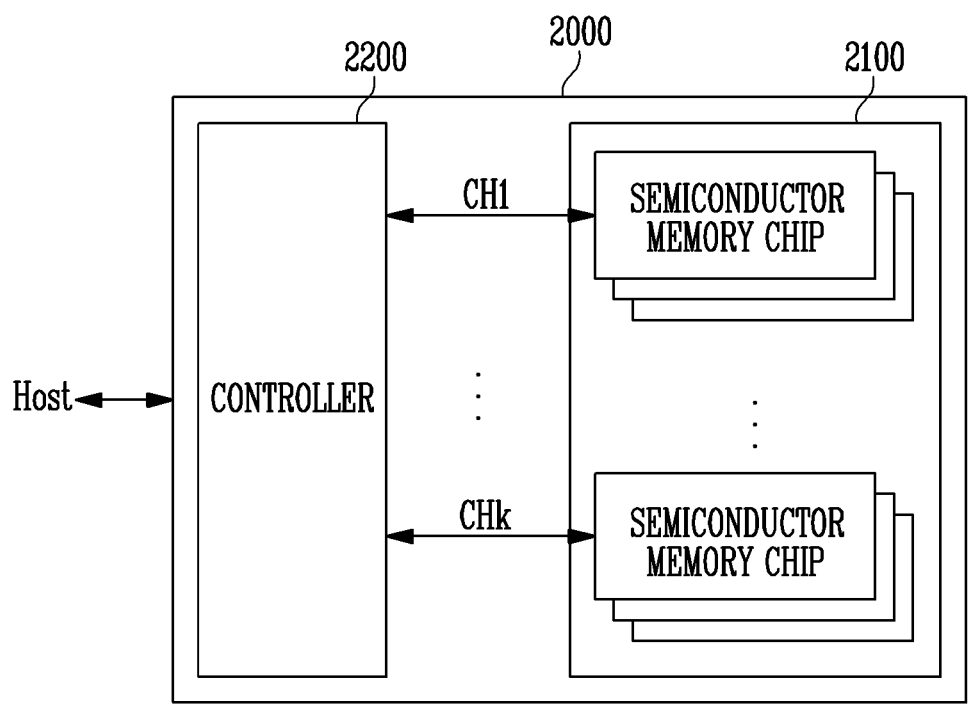
FIG. 12 is a block diagram illustrating an application example of a memory system, such as that of FIG. 11.

FIG. 12 is a block diagram illustrating an application example of the memory system 1000 of FIG. 11.

Referring to FIG. 12, the memory system 2000 includes a semiconductor memory device 2100 and a controller 2200. The semiconductor memory device 2100 includes a plurality of semiconductor memory chips. The plurality of semiconductor memory chips are divided into a plurality of groups, e.g., k groups.

In FIG. 12, the k groups communicate with the controller 2200 through first to k-th channels CH1 to CHk, respectively. Each semiconductor memory chip is configured and is operated similarly to the semiconductor memory device 100 described with reference to FIG. 2.

Each group is configured to communicate with the controller 2200 through one common channel. The controller 2200 is configured similarly to the controller 1200 described with reference to FIG. 11, and is configured to control the plurality of memory chips of the semiconductor memory device 2100 through the plurality of channels CH1 to CHk.

In FIG. 12, multiple semiconductor memory chips of the same group are connected to one channel. However, it may be understood that the memory system 2000 may be modified so that each semiconductor memory chip is connected to its own channel.

Figure 13:
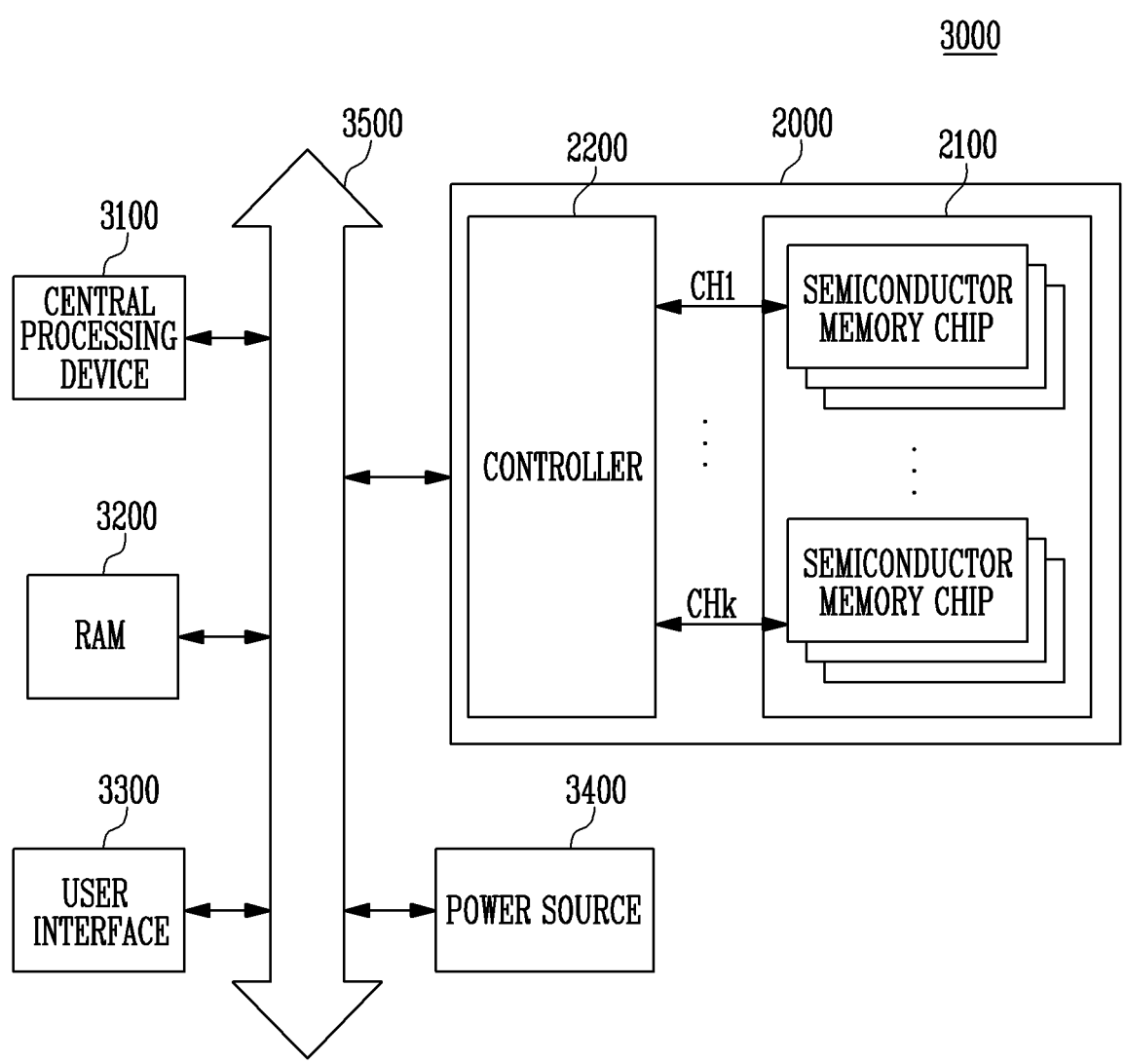
FIG. 13 is a block diagram showing a computing system including a memory system, such as that of FIG. 12.

FIG. 13 is a block diagram showing a computing system 3000 including the memory system 2000 described with reference to FIG. 12.

Referring to FIG. 13, the computing system 3000 includes a central processing device 3100, a random access memory (RAM) 3200, a user interface 3300, a power source 3400, a system bus 3500, and the memory system 2000.

The memory system 2000 is electrically connected to the central processing device 3100, the RAM 3200, the user interface 3300, and the power source 3400 through the system bus 3500. Data provided through the user interface 3300 or processed by the central processing device 3100 is stored in the memory system 2000.

In FIG. 13, the semiconductor memory device 2100 is connected to the system bus 3500 through the controller 2200. However, the semiconductor memory device 2100 may be configured to be directly connected to the system bus 3500. Functions of the controller 2200 may be performed by the central processing device 3100 and the RAM 3200.

In FIG. 13, the memory system 2000 described with reference to FIG. 12 is provided. However, the memory system 2000 may be replaced with the memory system 1000 described with reference to FIG. 11. In another embodiment, the computing system 3000 may be configured to include both of the memory systems 1000 and 2000 of FIGS. 11 and 12.

Although specific embodiments of the disclosure have been illustrated and described, those skilled in the art will understand in view of the present disclosure that various changes and modifications may be made without departing from the scope and technical spirit of the present disclosure. Therefore, the present invention is not limited to the above-described embodiments. Rather, the present invention encompasses all variations that fall within the scope of the claims including their equivalents.

What is claimed is:

1. A semiconductor memory device comprising:
a memory cell array including a plurality of memory cells for storing data;
a page buffer connected to at least one of the plurality of memory cells through a bit line and configured to read the data stored in the memory cell;
control logic configured to generate a plurality of control signals for controlling an operation of the page buffer; and
a voltage generator configured to generate activation voltages of the plurality of control signals,
wherein the page buffer comprises:
a first transistor connected between the bit line and a first node;
a second transistor connected between a power voltage and a second node;
a third transistor connected between the first node and the second node;
a fourth transistor connected between the second node and a third node; and
a fifth transistor connected between the first node and the third node, and
wherein the voltage generator is further configured to control an activation voltage of a first control signal controlling the fifth transistor among the plurality of control signals based on temperature of the semiconductor memory device.

2. The semiconductor memory device of claim 1, wherein the first transistor, the third transistor, and the fifth transistor are NMOS transistors, and the second transistor and the fourth transistor are PMOS transistors.

3. The semiconductor memory device of claim 1, wherein the voltage generator increases the activation voltage of the first control signal when the temperature of the semiconductor memory device decreases.

4. The semiconductor memory device of claim 1, wherein the voltage generator is further configured to control an activation voltage of a second control signal controlling the third transistor among the plurality of control signals based on the temperature of the semiconductor memory device.

5. The semiconductor memory device of claim 4, wherein the voltage generator increases the activation voltage of the second control signal when the temperature of the semiconductor memory device decreases.

6. The semiconductor memory device of claim 4, wherein the voltage generator is further configured to control an activation voltage of a third control signal controlling the first transistor among the plurality of control signals based on the temperature of the semiconductor memory device.

7. The semiconductor memory device of claim 6, wherein the voltage generator increases the activation voltage of the third control signal when the temperature of the semiconductor memory device decreases.

8. The semiconductor memory device of claim 1, wherein the page buffer further comprises:
sixth and seventh transistors connected in series between the first node and a ground voltage; and
a latch circuit connected to a gate of the second transistor and a gate of the seventh transistor.

9. The semiconductor memory device of claim 8, wherein the page buffer further includes an eighth transistor connected between the power voltage and the third node.

10. The semiconductor memory device of claim 6,
further comprising: a temperature sensor configured to generate a temperature code by sensing the temperature of the semiconductor memory device,
wherein the voltage generator controls the activation voltage of the first control signal, the second control signal, and the third control signal based on the temperature code.

11. The semiconductor memory device of claim 10, wherein the voltage generator includes a variable resistor of which a resistance value changes based on the temperature code.

12. The semiconductor memory device of claim 10, wherein the activation voltage of the first control signal is greater than the activation voltage of the second control signal.

13. The semiconductor memory device of claim 12, wherein the activation voltage of the second control signal is greater than the activation voltage of the third control signal.

14. A semiconductor memory device comprising:
a page buffer connected to a bit line and configured to sense a threshold voltage of a memory cell; and
a voltage generator configured to generate activation voltages of a plurality of control signals to be input to the page buffer,
wherein the page buffer comprises:
a first NMOS transistor connected between the bit line and a common node;
a first PMOS transistor connected between a power voltage and a sense amplifier node;
a second NMOS transistor connected between the sense amplifier node and the common node;
a second PMOS transistor connected between the sense amplifier node and a sensing node; and
a third NMOS transistor connected between the common node and the sensing node, and
wherein the voltage generator is further configured to control an activation voltage of a sense amplifier sensing signal applied to a gate of the third NMOS transistor, among the plurality of control signals, based on temperature of the semiconductor memory device.

15. The semiconductor memory device of claim 14, wherein the voltage generator is further configured to control an activation voltage of a current sensing signal applied to a gate of the second NMOS transistor, among the plurality of control signals, based on the temperature of the semiconductor memory device.

16. The semiconductor memory device of claim 15, wherein the voltage generator controls the activation voltages of the sense amplifier sensing signal and the current sensing signal by increasing the activation voltages of the sense amplifier sensing signal and the current sensing signal when the temperature of the semiconductor memory device decreases.

17. The semiconductor memory device of claim 16, wherein the activation voltage of the sense amplifier sensing signal is greater than the activation voltage of the current sensing signal.

18. The semiconductor memory device of claim 17, wherein the voltage generator is further configured to control an activation voltage of a page buffer sensing signal applied to a gate of the first NMOS transistor, among the plurality of control signals, based on the temperature of the semiconductor memory device.

19. The semiconductor memory device of claim 18, wherein the voltage generator increases the activation voltage of the page buffer sensing signal when the temperature of the semiconductor memory device decreases.

20. The semiconductor memory device of claim 14, wherein the page buffer further comprises:
- fourth and fifth NMOS transistors connected in series between the common node and a ground voltage;
- a third PMOS transistor connected between the power voltage and the sensing node; and
- a sensing latch circuit connected to a gate of the first PMOS transistor and a gate of the fifth NMOS transistor.

* * * * *